(12) United States Patent
Chan et al.

(10) Patent No.: US 7,071,103 B2
(45) Date of Patent: Jul. 4, 2006

(54) CHEMICAL TREATMENT TO RETARD DIFFUSION IN A SEMICONDUCTOR OVERLAYER

(75) Inventors: Kevin K. Chan, Staten Island, NY (US); Huajie Chen, Danbury, CT (US); Michael A. Gribelyuk, Stamford, CT (US); Judson R. Holt, Wappingers Falls, NY (US); Woo-Hyeong Lee, Poughquag, NY (US); Ryan M. Mitchell, Wake Forest, NC (US); Renee T. Mo, White Plains, NY (US); Dan M. Mocuta, Lagrangeville, NY (US); Werner A. Rausch, Stormville, NY (US); Paul A. Ronsheim, Hopewell Junction, NY (US); Henry K. Utomo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 10/710,737

(22) Filed: Jul. 30, 2004

(65) Prior Publication Data

US 2006/0024934 A1    Feb. 2, 2006

(51) Int. Cl.
*H01L 21/44* (2006.01)
(52) U.S. Cl. ...................... 438/653; 438/627; 438/643

(58) Field of Classification Search ............... None
See application file for complete search history.

(56) References Cited

U.S. PATENT DOCUMENTS

| 4,772,927 | A | * | 9/1988 | Saito et al. ............... 257/66 |
| 5,429,708 | A | * | 7/1995 | Linford et al. ............ 216/66 |
| 5,605,860 | A | * | 2/1997 | Kawasaki et al. ......... 438/48 |
| 5,731,626 | A | | 3/1998 | Eaglesham et al. |
| 5,967,794 | A | | 10/1999 | Kodama |
| 6,043,139 | A | | 3/2000 | Eaglesham et al. |
| 6,160,300 | A | * | 12/2000 | Gardner et al. ......... 257/412 |
| 6,271,551 | B1 | | 8/2001 | Schmitz et al. |
| 2002/0139975 | A1 | * | 10/2002 | Lewis et al. ............. 257/40 |

\* cited by examiner

*Primary Examiner*—Zandra V. Smith
*Assistant Examiner*—Khanh Duong
(74) *Attorney, Agent, or Firm*—Scully, Scott, Murphy & Presser, P.C.; Todd M. C. Li, Esq.

(57) ABSTRACT

The present invention provides a method for retarding the diffusion of dopants from a first material layer (typically a semiconductor) into an overlayer or vice versa. In the method of the present invention, diffusion of dopants from the first semiconductor into the overlayer or vice versa is retarded by forming a monolayer comprising carbon and oxygen between the two layers. The monolayer is formed in the present invention utilizing a chemical pretreatment process in which a solution including iodine and an alcohol such as methanol is employed.

25 Claims, 4 Drawing Sheets

US 7,071,103 B2

CHEMICAL TREATMENT TO RETARD DIFFUSION IN A SEMICONDUCTOR OVERLAYER

BACKGROUND OF INVENTION

The present invention relates to semiconductor devices, and more particularly to a method of fabricating a semiconductor structure that includes a carbon and oxygen containing monolayer between a first material layer such as, for example, a first semiconductor layer and any other film, such as, for example, a second semiconductor layer, that overlays the first material layer. This monolayer can serve as a barrier to dopant diffusion during subsequent thermal processing.

Controlling dopant diffusion is highly desirable in the fabrication of semiconductor devices. Nontraditional metal oxide semiconductor field effect transistors (MOSFETs), such as super steep retrograde well devices, require that the high dose well dopants remain in the ground plane and do not diffuse into the undoped channel regions. Even conventional p-MOSFETs require that boron in the gate electrode does not penetrate the gate dielectric.

Diffusion is traditionally limited in the prior art by minimizing the thermal cycles during processing. Despite its use to limit diffusion, this prior art approach limits the flexibility of the process integration.

Additionally, diffusion is minimized in some prior art processes by growing a film atop a semiconductor layer to retard dopant diffusion. An example of this prior art approach is the growth of a SiC film atop a semiconductor layer. The SiC film has been shown to minimize boron diffusion. The technique of growing a film atop a semiconductor layer to minimize dopant diffusion can add additional challenges to the semiconductor manufacturer, such as, for example, the need for modifying the dry etching processes for heterogeneous stacks that will now include the dopant diffusion minimizing film.

Another prior art method for minimizing dopant diffusion includes co-implantation of a diffusion retarding element into a semiconductor layer. This prior art approach however is also problematic since the co-implanted element would be distributed throughout the semiconductor layer, instead of being confined to an interface.

Some examples of prior art methods to control dopant diffusion include:

I. U.S. Pat. No. 5,731,626 to Eagelsham, et al. provides a process for controlling the diffusion of ion-implanted dopant atoms in a semiconductor layer. In accordance with the method disclosed in Eagelsham, et al., the diffusion of ion-implanted dopant atoms in a deposited semiconductor layer is controlled by incorporating a diffusion-suppressing amount of an electrically inactive impurity in the semiconductor layer by a crystal growth technique. The electrically inactive impurity is any atom or molecule which, when introduced to a semiconductor layer, will not interfere with the electrical properties of the semiconductor. One example of an electrically inactive impurity in the Eagelsham, et al. disclosure is substitutional carbon.

II. U.S. Pat. No. 5,967,794 to Kodama discloses a method of fabricating a semiconductor device with a shallow (on the order of 50 nm) PN junction depth. In the '794 disclosure, a silicon layer containing a substance such as carbon which combines with point defects in the semiconductor substrate is grown atop the substrate to prevent an impurity from diffusing.

III. U.S. Pat. No. 6,271,551 to Schmitz, et al. retards dopant diffusion by providing a thin layer of $Si_{1-x}Ge_x$ between a strongly doped layer and an intrinsic surface region.

Despite the above advances in the art for minimizing dopant diffusion, there is still a need for a new and improved method whereby dopant diffusion can be substantially retarded, which does not require significant modifications to existing semiconductor processing techniques and does not disrupt the alignment of an overlying film to the lattice of a semiconductor substrate.

SUMMARY OF INVENTION

The present invention provides a method for substantially retarding diffusion of dopants from a first material layer such as a first semiconductor layer into an overlaying film such as a second semiconductor layer, or from an overlaying film layer into a first material layer. In accordance with the method of the present invention, the diffusion of dopant ions (either n or p-type) that have been previously formed into one of the layers of the structure can be substantially retarded by a chemical treatment step that is performed prior to deposition of the other film atop the first material layer. The chemical treatment step employed in the present invention involves the formation of a carbon and oxygen containing monolayer on the surface of a precleaned and hydrogen terminated first material layer. The monolayer comprising carbon and oxygen is formed in the present invention by applying a solution containing iodine and an alcohol to the precleaned and hydrogen terminated surface of a first material layer.

In the case where the first material layer is a first semiconductor layer, the application of the solution of iodine and alcohol modifies the precleaned and hydrogen terminated surface of the first semiconductor layer such that an alkoxy group forms wherein the oxygen atom of the alkoxy group is attached to the semiconductor element, e.g., Si, of the first semiconductor layer and the alkyl of the alkoxy group is attached to the oxygen atom. Without wishing to be bound to any theory, it is believed that during the iodine/alcohol treatment step, iodine replaces hydrogen on the surface of the hydrogen terminated first semiconductor layer and then the iodine is replaced by an alkoxy group of the alcohol. A by-product of the iodine/alcohol treatment step is HI.

After performing the inventive iodine/alcohol treatment step, the first material layer is rinsed and dried using a surface tension gradient dry and thereafter another film, typically a second semiconductor layer, is formed atop the iodine/alcohol modified first material layer. Substantially little or no dopant diffusion from the first material layer to the overlaying film, or vice versa, is observed after formation of the other film atop the first material layer. The diffusion of dopants from the first material layer to the other film, or vice versa, is also substantially retarded even after performing high temperature anneals.

In a preferred application of the present invention, the method of the present invention forms a monolayer comprising oxygen and carbon between a first semiconductor layer and a second semiconductor layer. In this preferred application, the method of the present invention includes the steps of forming a monolayer comprising carbon and oxygen on a first semiconductor layer that includes dopants therein; and forming a second semiconductor layer atop the first semiconductor layer, wherein the monolayer which is located between the first and the second semiconductor layer, substantially retards diffusion of the dopants from the first semiconductor layer to the second semiconductor layer.

The method described above provides a simple technique for creating a carbon and oxygen containing monolayer between a first semiconductor layer and an overlying second semiconductor layer. It should be noted that in some applications the second semiconductor layer could be replaced by another material that is insulating or conductive. Alternatively, the other material could be any combination of semiconducting, insulating and conductive materials.

DETAILED DESCRIPTION

The present invention, which provides a simple method for substantially retarding dopant diffusion from a first material layer into an overlying film or vice versa, will now be described in more detail.

Figure 1A:
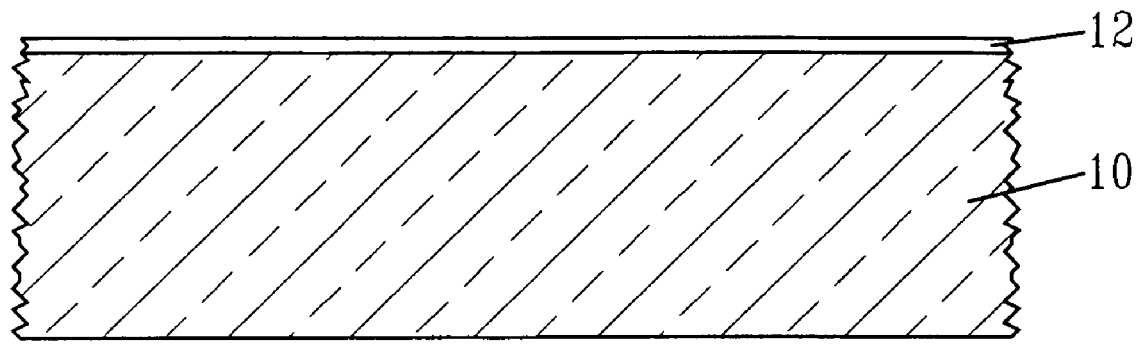
FIGS. 1A–1B are pictorial representations (through cross sectional views) depicting the basic processing steps of the present invention.
Figure 1B:
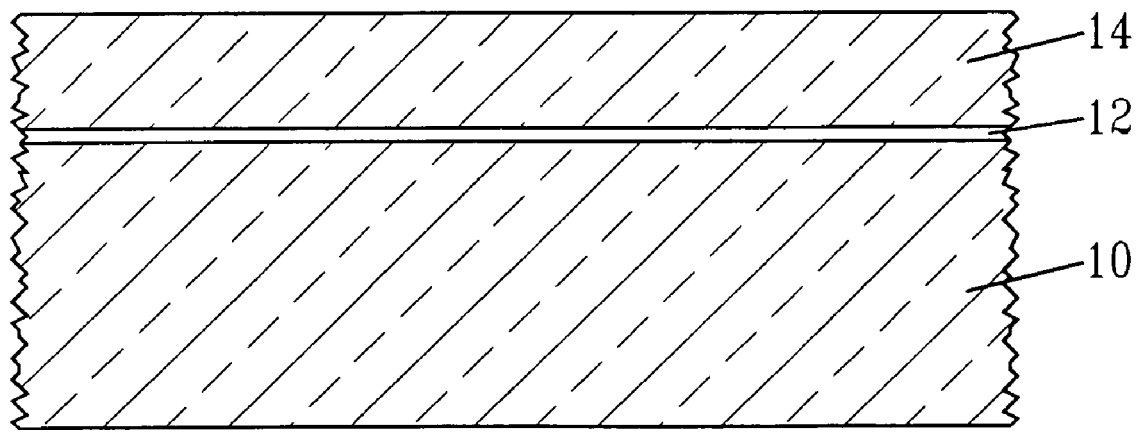

Reference is first made to FIGS. 1A–1B which illustrates the basic processing steps of the present invention. In the drawings and description that follow, the layer formed above the first semiconductor layer is described as being a second semiconductor layer. Although this embodiment is disclosed and described in detail, the second semiconductor layer can be replaced by an insulating layer, a conductive layer or a stack containing any combination of semiconducting, insulating and conductive layers. In some embodiments, the first semiconductor layer can be replaced with an insulating layer and the second layer can be a conductive layer. Also, it is possible to use the present invention in cases in which the first semiconductor layer is undoped and the second semiconductor layer is doped. The alternate doping configuration is also contemplated herein.

The term "semiconductor layer" is used throughout the present application to denote a material whose electrical conductivity is between that of a conductor and that of an insulator. Illustratively, the semiconductor can be comprised of Si, SiC, SiGe, SiGeC, Ge, GaAs, InAs, InP as well as other III/V or II/VI compound semiconductors. The semiconductor layer(s) may also comprise a silicon-on-insulator (SOI) substrate, a SiGe-on-insulator (SGOI) substrate or any other layered semiconductor such as, for example, Si/SiGe. The semiconductor layer(s) may be strained, unstrained or have both unstrained and strained regions. The semiconductor layer(s) may also be crystalline, semi-crystalline or non-crystalline.

In embodiments wherein a first semiconductor layer and a second semiconductor layer are employed, the two semiconductor layers may be comprised of the same semiconductor material, i.e., both comprised of Si, or they can be comprised of different semiconductor materials, i.e., first layer comprising Si and second layer comprising Ge.

Prior to performing the iodine/alcohol treatment step of the present invention that forms the carbon and oxygen containing monolayer, native oxide present as a surface layer on the first semiconductor layer or screen oxide is typically removed using a conventional precleaning process that is capable of removing the native oxide surface layer from the first semiconductor layer. Illustrative examples of processes that can be used in removing the native oxide surface layer from the first semiconductor layer include, but are not limited to: sulfuric acid and peroxide mixtures, ammonium hydroxide and peroxide mixtures, and hydrochloric acid and peroxide mixtures. The final step of the preclean should include hydrofluoric acid or buffered hydrofluoric acid either in an aqueous or alcohol solution or in the gas phase. This process leaves a hydrogen-terminated surface. By "hydrogen terminated" it is meant that the outer surface of the first semiconductor layer includes hydrogen atoms. In the case of Si, the hydrogen termination results in a structure having Si—H bonds.

In some embodiments of the present invention, the hydrogen termination can be provided by annealing in a hydrogen-containing ambient. The hydrogen annealing is performed using standard conditions that are well known to those skilled in the art. In accordance with the preferred embodiment of the present invention, the first semiconductor layer includes dopant ions therein. The dopant ions are formed into the first semiconductor layer anytime prior to the iodine/alcohol treatment step of the present invention utilizing ion implantation. Typically, dopant ions are implanted prior to removal of the native oxide surface layer from the first semiconductor layer. The ion implantation step may be performed using a blanket ion implantation process, or a selective ion implantation process may be utilized.

The dopant ions can be p-type dopants such as B or BF$_2$ ions, or n-type dopants such as P, As, or Sb ions. The dose of dopant ions implanted within the first semiconductor layer may vary depending on the ions that are being implanted and the preferred device characteristics. Typically, the dopant ions are implanted within the first semiconductor layer with a dose from about 1E11 to about 1E16 atoms/cm$^2$. The energy of the ion implantation step may vary depending on the structure being formed and the type of dopant ions being implanted. Typically, the ion implantation is performed at an energy from about 1 to about 65 keV, with an energy from about 10 to about 30 keV being more typical. In a preferred embodiment of the present invention, the dopant ions are B ions that are implanted into an SOI layer of an SOI wafer.

After removing the native oxide surface layer and terminating the first semiconductor layer with hydrogen atoms, the first semiconductor layer is subjected to the iodine/alcohol treatment step of the present invention. This chemical treatment step results in the formation of a monolayer comprising carbon and oxygen on the surface of the first semiconductor layer.

The term "monolayer" as used throughout this application denotes a single termination layer wherein each Si atom (or like atom of the first material layer) is bonded to at least one alkoxy group. A monolayer comprising C and O is different from a film that contains said atoms since a film implies multilayer termination. Moreover, a film has nucleation issues which result in initial island growth prior to full coverage. The alkoxy termination, on the other hand, saturates at a single monolayer. Films may disrupt the growth of the subsequent overlayers, while a monolayer will likely not.

Specifically, a solution comprising iodine and an alcohol is applied to the first semiconductor layer containing implanted dopants. The solution is prepared by adding the two components together and then thoroughly mixing the same. The application of the iodine/alcohol solution may occur by immersion, dip coating, spray coating, or other like coating process. In some embodiments, the solution can be evaporated and applied as gaseous mixture as well. The application of the iodine/alcohol solution to the first semiconductor layer typically occurs at room temperature (i.e., 20° C.). Although room temperature is typically employed, the solution containing iodine and alcohol may be applied at temperatures that are slightly elevated from room temperature. The contact time for the solution containing iodine and alcohol may vary depending on the type of alcohol in the solution and the reaction temperature. Typically, the contact of the solution containing iodine and alcohol to the first semiconductor layer is from about 15 to about 60 minutes, with a contact time from about 20 to about 30 minutes being more typical.

As indicated above, the solution employed in the present invention for forming the monolayer of carbon and oxygen comprises iodine and alcohol. The amount of iodine present in the solution is from about $1 \times 10^{-3}$ to about $1 \times 10^{-5}$ M, with about $5 \times 10^{-4}$ M being more typical.

The alcohol employed in the solution may comprise any straight chain or branched monohydric alcohol, including for example, methanol, ethanol, n-propanol, isopropanol, butanol, pentanol, heptanol, octanol, nanonol, and mixtures thereof. Methanol and ethanol are preferred in the present invention, with methanol being particularly preferred. Although branched chain alcohols work, straight chain alcohols work better due to reduced steric hinderance of those alcohols.

When methanol is employed, a highly preferred iodine/methanol solution used in forming the monolayer of carbon and oxygen comprises about $5 \times 10^{-4}$ M iodine in methanol.

FIG. 1A shows the structure that is formed after the above steps have been performed. In this drawing, reference numeral 10 denotes the first semiconductor layer after implantation, precleaning and hydrogen termination, while reference numeral 12 denotes the monolayer comprising carbon and oxygen. Although not shown, the oxygen atoms of the monolayer 12 are bound to the surface of the first semiconductor layer 10 and the carbon atoms of the monolayer 12 are bound to the oxygen atoms.

After contact with the iodine/alcohol solution, the treated structure is typically rinsed in an alcohol and then dried using a standard drying process well known in the art. The alcohol used to rinse the structure is typically, but not necessarily, the same alcohol as present in the iodine/alcohol solution. A typical drying process that can be used in the present invention includes a surface tension drying process wherein a mist including isopropanol and water is employed.

Next, and as shown in FIG. 1B, a second semiconductor layer 14 (or any other film) is formed atop the structure shown in FIG. 1A. The second semiconductor layer 14 (or any other film) is formed utilizing a conventional deposition process including for example, chemical vapor deposition, evaporation, plasma-assisted chemical vapor deposition, vapor deposition, sputtering, chemical solution deposition and other like deposition processes. The second semiconductor layer 14 can also be deposited by an epitaxial growth process. The deposition typically occurs at temperatures that are higher than 500° C. At these deposition temperatures, diffusion of dopants from the first semiconductor layer 10 into the second semiconductor layer 14 typically occurs if the inventive monolayer 12 is not present between the two semiconductor layers. In the present invention, the monolayer 12 substantially retards the diffusion of dopants from the first semiconductor layer 10 into the second semiconductor layer 14. A build-up of dopants at the interface between the two semiconductor layers may occur after deposition.

Following formation of the second semiconductor layer 14, the structure shown in FIG. 1B is typically subjected to an annealing process in the course of subsequent processing. It is noted that the activation anneal for the dopants in the first semiconductor layer is usually performed prior to depositing the second semiconductor layer. Anneals are typically performed at a temperature that is greater than 900° C., with a temperature of greater than 950° C. being more typical. The subsequent anneals can be carried out using furnace anneal processes, spike anneal processes, laser anneal processes, and/or rapid thermal anneal processes. The furnace anneal typically requires longer annealing times than the other anneals. In one embodiment of the present invention, the dopants are activated using a rapid thermal anneal at a temperature of about 1000° C., for a time period of less than 10 seconds. A build-up of dopants at the interface between the two semiconductor layers may occur after annealing.

At such annealing temperatures, diffusion of dopants from the first semiconductor layer 10 into the second semiconductor layer 14 typically occurs if the inventive monolayer 12 is not present between the two semiconductor layers. In the present invention, the monolayer 12 substantially retards the diffusion of dopants from the first semiconductor layer 10 into the second semiconductor layer 14.

In addition to the embodiment described above, the present invention also works in providing a diffusion inhibiting layer for the case where the first semiconductor layer 10 is intrinsic and the second semiconductor layer 14 is in-situ doped. This scenario is particularly useful for providing replacement junction structures. The present invention can also be used to prevent the diffusion of dopants from a gate conductor into a gate dielectric (i.e., boron penetration). In that embodiment, the first material layer is an insulator and the overlayer is a conductor.

The following example illustrates the process of the present invention as well as showing some advantages of the same over a sample that does not undergo the iodine/alcohol treatment step mentioned above.

EXAMPLE

In this example, two silicon-on-insulator (SOI) substrates, each having an SOI layer that has a thickness of about 50 nm were employed. Each of the SOI substrates, in particular each SOI layer, was doped with boron by ion implantation using an ion dose of 2E13 B atoms/cm$^2$ at 10 keV. The samples were then annealed at about 1000° C. for less than 10 seconds.

Each SOI substrate was then subjected to a step in which the SOI layer was hydrogen terminated. The hydrogen termination was provided by applying dilute hydrofluoric acid to each of the SOI substrates. After hydrogen termination, one of SOI substrates was soaked in a solution of $5 \times 10^{-4}$ M iodine in methanol to provide a methoxy termination comprising carbon and oxygen to the SOI layer. The iodine/methanol soak occurred at room temperature for about 20 minutes. The soaked SOI substrate was then rinsed with methanol and dry utilizing a standard surface tension gradient drying process.

A Si layer having a thickness of about 40 nm was deposited at 750° C. on each of the SOI substrates processes above. The SOI substrate that was not subjected to the iodine/methanol treatment represents a comparative sample, while the SOI substrate treated with iodine/methanol is representative of the present invention.

Figure 2:
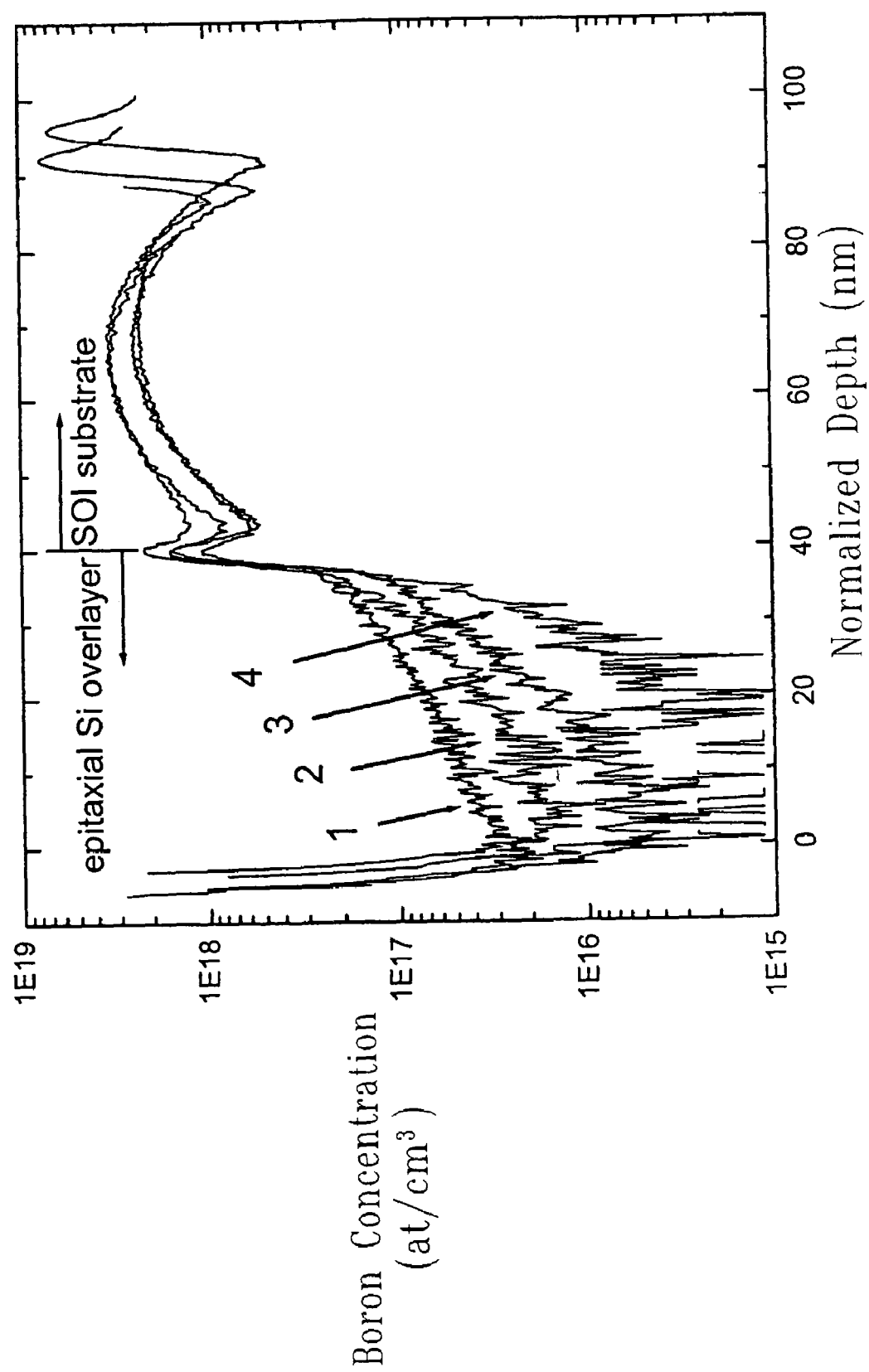
FIG. 2 shows the boron SIMS data from silicon-on-insulator (SOI) wafers that have been implanted with a dose of boron of 2E13 atoms/cm$^2$ at 10 keV and then cleaned and deposited with Si at 750° C.

The boron SIMS data for each sample was then collected after deposition and after a post deposition anneal, 1000° C., 5 seconds. FIG. 2 shows the boron SIMS data for the above experimentation. In FIG. 1, Curve 1 denotes the SIMS data for the comparative sample after post deposition annealing, Curve 2 represents the SIMS data for the comparative sample after deposition of the Si overlayer (prior to annealing), Curve 3 represents the inventive sample after the post deposition anneal and Curve 4 represents the inventive sample after deposition of the Si overlayer (prior to annealing).

The SIMS data shown in FIG. 2 illustrates that the sample of the present invention, as deposited and after performing the post deposition anneal, had less boron diffusion into the Si overlayer than the sample without the treatment step of the present invention.

Figure 3:
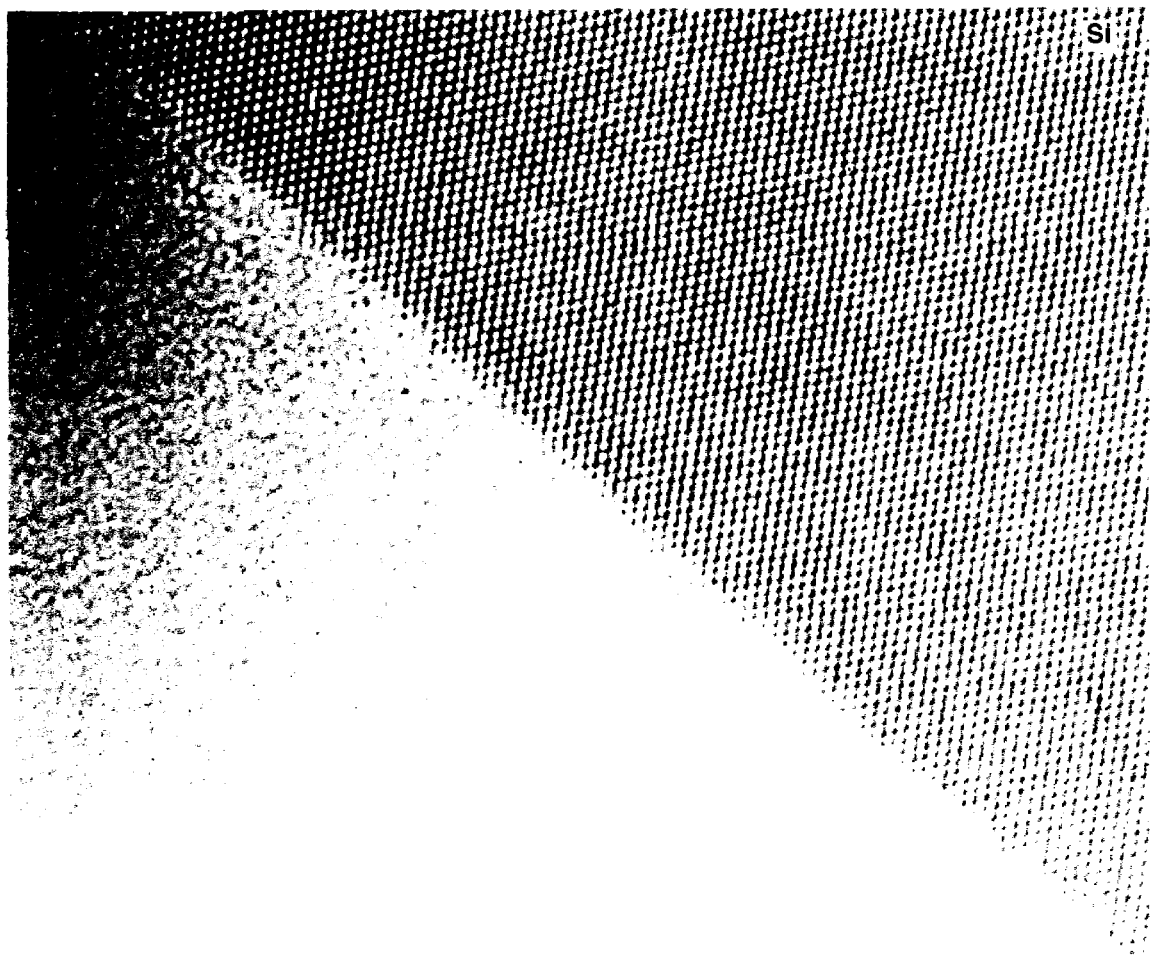
FIG. 3 is an atomic resolution TEM image of an SOI substrate after the iodine/methanol treatment step of the present invention and 850° C. Si growth.
Figure 4:
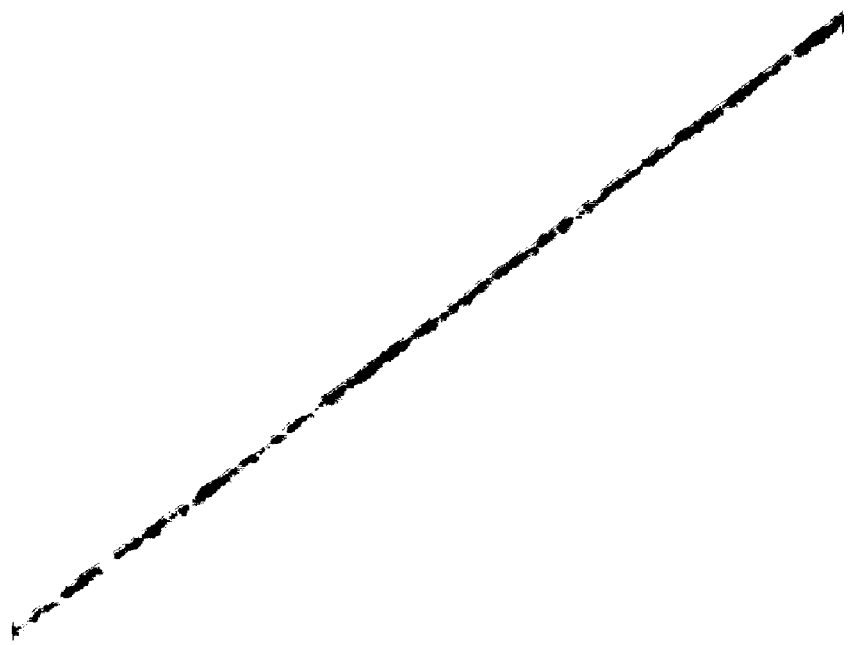
FIG. 4 is a lower resolution TEM image of an SOI substrate after the iodine/methanol treatment step of the present invention and 850° C. Si growth.

Another SOI substrate was processed using the iodine/methanol treatment method of the present invention described above and thereafter the sample was annealed in vacuum at 850° C. and then a Si overlayer having a thickness of about 30 nm was deposited at 850° C. The high-resolution (3 nm scale) TEM image and low resolution (50 nm scale) TEM of this sample are shown in FIGS. 3 and 4, respectively. The TEMs illustrate that the iodine/methanol treatment step of the present invention does not disrupt the alignment of the Si overlayer on the original SOI layer. The carbon and oxygen doses for the interface between the SOI layer and the Si overlayer were 1.1E4 atoms/cm$^2$ and 1.1E13 atoms/cm$^2$, respectively. The interface is not visible by TEM, and the lattice of the SOI substrate is not distinguishable from the epitaxial Si overlayer.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of controlling dopant diffusion comprising:
   forming a monolayer comprising carbon and oxygen on a first semiconductor layer that includes dopants therein, said monolayer substantially retards diffusion of dopants;
   annealing said first semiconductor layer and said monolayer to activate said dopants; and
   forming a second semiconductor layer on said monolayer.

2. The method of claim 1 wherein said first semiconductor layer is subjected to a step in which a surface native oxide layer is removed prior to forming said monolayer.

3. The method of claim 2 wherein said surface native oxide layer is removed by a hydrofluoric acid-containing solution.

4. The method of claim 1 wherein said first semiconductor layer is subjected to a hydrogen termination processing step prior to forming said monolayer.

5. The method of claim 4 wherein said hydrogen termination processing step comprises contacting the first semiconductor layer with hydrofluoric acid either in solution or in the gas phase.

6. The method of claim 4 wherein said hydrogen termination processing step comprises a hydrogen anneal.

7. The method of claim 1 wherein said dopants are n-type dopants or p-type dopants.

8. The method of claim 1 wherein said second semiconductor layer is doped.

9. The method of claim 1 wherein said forming said monolayer comprises contacting the first semiconductor layer with a solution comprising iodine and an alcohol.

10. The method of claim 9 wherein said solution comprising iodine and an alcohol contains from about $1 \times 10^{-3}$ to about $1 \times 10^{-5}$ M of iodine in alcohol.

11. The method of claim 9 wherein said alcohol comprises methanol.

12. The method of claim 1 wherein said forming a second semiconductor layer comprises a deposition process that is performed at a temperature of about 500° C. or greater.

13. A method of controlling dopant diffusion comprising:
   forming a monolayer comprising carbon and oxygen on a first material layer; and
   forming an overlayer on said monolayer, wherein one of said first material layer or said overlayer contains dopants and said monolayer substantially retards diffusion of said dopants; and
   annealing said first material layer, said monolayer and said overlayer.

14. The method of claim 13 wherein said first material layer is a first semiconductor layer which is subjected to a step in which a surface native oxide layer is removed prior to forming said monolayer.

15. The method of claim 13 wherein said first material layer is subjected to a hydrogen termination processing step prior to forming said monolayer.

16. The method of claim 15 wherein said hydrogen termination processing step comprises contacting the first material layer with a hydrofluoric acid-containing solution, a gas phase containing hydrofluoric acid or a hydrogen anneal.

17. The method of claim 13 wherein said dopants are n-type dopants or p-type dopants.

18. The method of claim 13 wherein said dopants are located in said first material layer.

19. The method of claim 13 wherein said dopants are located in said overlayer.

20. The method of claim 19 wherein said alcohol comprises methanol.

21. The method of claim 13 wherein said forming said monolayer comprises contacting the first material layer with a solution comprising iodine and an alcohol.

22. The method of claim 21 wherein said solution comprising iodine and an alcohol contains from about $1 \times 10^{-3}$ to about $1 \times 10^{-5}$ M of iodine in alcohol.

23. The method of claim 13 wherein said overlayer comprises a semiconductor material, an insulator, a conductor or any combination thereof.

24. The method of claim 13 wherein said forming the overlayer comprises a deposition process that is performed at a temperature of about 500° C. or greater.

25. The method of claim 13 wherein said first material layer comprises an insulator and the overlayer comprises a conductor.

* * * * *